(12) United States Patent
Hodota

(10) Patent No.: US 8,492,785 B2
(45) Date of Patent: Jul. 23, 2013

(54) SEMICONDUCTOR LIGHT-EMITTING ELEMENT AND SEMICONDUCTOR LIGHT-EMITTING DEVICE

(75) Inventor: Takashi Hodota, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 13/368,629

(22) Filed: Feb. 8, 2012

(65) Prior Publication Data

US 2012/0199860 A1    Aug. 9, 2012

(30) Foreign Application Priority Data

Feb. 9, 2011    (JP) .................. 2011-026577

(51) Int. Cl.
*H01L 33/00*    (2010.01)
(52) U.S. Cl.
USPC ............... 257/98; 257/79; 257/103; 438/29; 438/31
(58) Field of Classification Search
USPC . 257/98, 103, 79, E33.072, E29.143; 438/29, 438/31
See application file for complete search history.

(56) References Cited

U.S. PATENT DOCUMENTS

| | | | |
|---|---|---|---|
| 8,115,212 B2 * | 2/2012 | Miki et al. | 257/79 |
| 2004/0222434 A1 * | 11/2004 | Uemura et al. | 257/99 |
| 2009/0159902 A1 | 6/2009 | Yasuda et al. | |

FOREIGN PATENT DOCUMENTS

JP    2007-173269 A    7/2007

* cited by examiner

*Primary Examiner* — Theresa T Doan
(74) *Attorney, Agent, or Firm* — Sughrue Mion, PLLC

(57) ABSTRACT

In a FC-mounted semiconductor light-emitting element, rise of a forward voltage is suppressed and light emission output is increased. A semiconductor light-emitting element includes: a laminated semiconductor layer including a first semiconductor layer having a first conduction type, a light-emitting layer and a second semiconductor layer having a second conduction type opposite to the first conduction type; a first electrode connected to the first semiconductor layer; and a second electrode provided on the second semiconductor layer, the second electrode including: a transparent conductive layer having thick portions and transparent to light from the light-emitting layer; an insulation layer laminated on the transparent conductive layer with a lower refractive index than the transparent conductive layer; a conductive metal reflecting layer laminated on the insulation layer; and a conductor portion provided through the insulation layer, which is electrically connected to one of the thick portions and the metal reflecting layer.

8 Claims, 11 Drawing Sheets

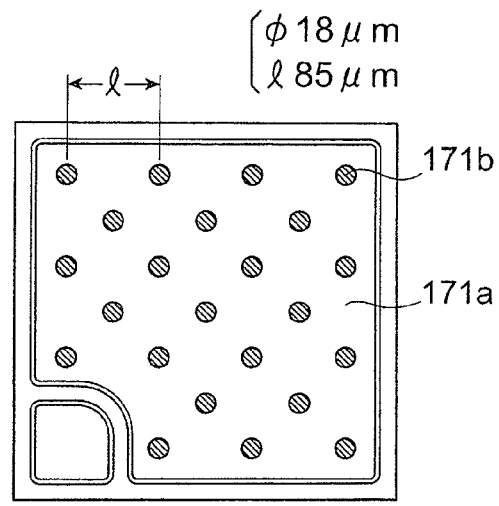
FIG.7A PATTERN 1
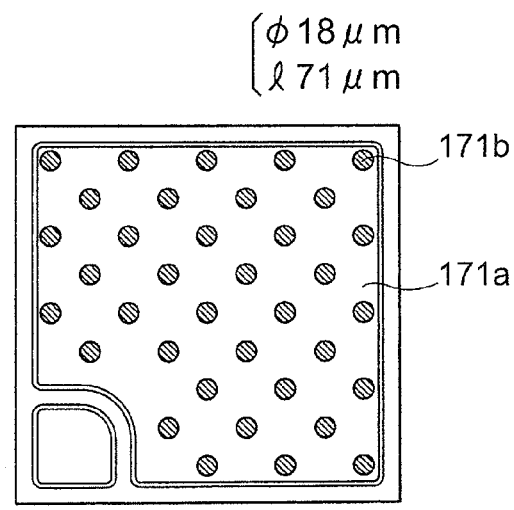
FIG.7B PATTERN 2
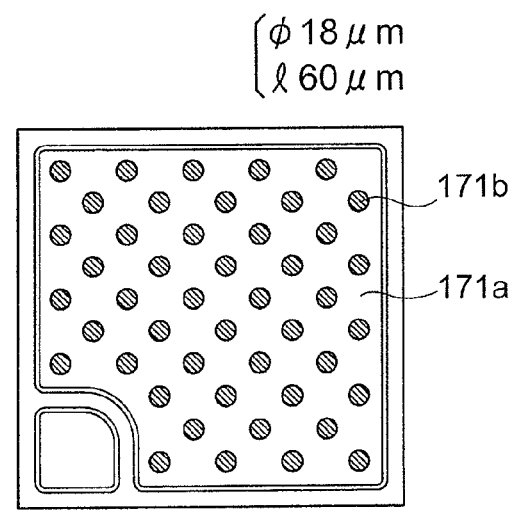
FIG.7C PATTERN 3

PATTERN 4

PATTERN 5

PATTERN 6

IZODOT II-(1)

IZODOT II-(2)

IZODOT II-(3)

SEMICONDUCTOR LIGHT-EMITTING ELEMENT AND SEMICONDUCTOR LIGHT-EMITTING DEVICE

CROSS REFERENCE TO RELATED APPLICATIONS

This application is based on and claims priority under 35 USC §119 from Japanese Patent Application No. 2011-026577 filed Feb. 9, 2011.

BACKGROUND

1. Technical Field

The present invention relates to a semiconductor light-emitting element and a semiconductor light-emitting device.

2. Related Art

In a semiconductor light-emitting element, generally, a bonding pad is formed at a portion connecting to a bonding wire made of gold (Au) or the like, the portion being on a transparent electrode. Recently, a flip-chip bonding (FC) mount technology has been developed, in which a semiconductor light-emitting element formed on a substrate transparent to light emission wavelength is reversed and mounted on a circuit board (submount) or a package.

For example, in Japanese Patent Application Laid-open Publication No. 2007-173269, a flip-chip semiconductor light-emitting device, which is provided with: a translucent substrate; a semiconductor layer in which an n-type semiconductor layer, a light-emitting layer and a p-type semiconductor layer are laminated; a negative electrode connected to the n-type semiconductor layer; a positive electrode connected to the p-type semiconductor layer; and a positive electrode pad and a negative electrode pad connected to the positive electrode and the negative electrode, respectively, is disclosed.

According to the FC mount technology, absorption of light emitted from the light emitting-layer is apt to be reduced due to reducing the thickness of the transparent conductive layer constituting the positive electrode. However, a sheet resistance of the transparent conductive layer is apt to be increased if the thickness of the transparent conductive layer is excessively reduced. Therefore, there is a possibility that poor diffusion of the current is caused and a forward voltage (Vf) is raised.

It is an object of the present invention, in the FC mount technology of the semiconductor light-emitting element, to suppress rising of the forward voltage (Vf) and increase light emission output (Po).

SUMMARY

According to a first aspect of the present invention, a semiconductor light-emitting element includes: a laminated semiconductor layer in which a first semiconductor layer having a first conduction type, a light-emitting layer and a second semiconductor layer having a second conduction type that is opposite to the first conduction type are laminated; a first electrode that is connected to the first semiconductor layer; and a second electrode that is provided on a surface of the second semiconductor layer, the second electrode including: a transparent conductive layer that includes plural thick portions thicker than other portions and has transparency to light emitted from the light-emitting layer; an insulation layer that is laminated on the transparent conductive layer and has a refractive index lower than a refractive index of the transparent conductive layer; a metal reflecting layer that is laminated on the insulation layer and has conductivity; and a conductor portion that is provided through the insulation layer, one end of which is electrically connected to one of the thick portions of the transparent conductive layer and the other end of which is electrically connected to the metal reflecting layer.

According to a second aspect of the present invention, in the first aspect of the semiconductor light-emitting element, the thick portions have convex portions on a side of the insulation layer.

According to a third aspect of the present invention, in the first aspect of the semiconductor light-emitting element, the thick portions include any one of an isolation pattern and a lattice pattern in a planar view.

According to a fourth aspect of the present invention, in the first aspect of the semiconductor light-emitting element, the insulation layer is composed of silicon dioxide.

According to a fifth aspect of the present invention, in the first aspect of the semiconductor light-emitting element, the transparent conductive layer is composed of conductive oxide containing indium (In).

According to a sixth aspect of the present invention, in the first aspect of the semiconductor light-emitting element, the laminated semiconductor layer is composed of a group III nitride semiconductor.

According to a seventh aspect of the present invention, in the first aspect of the semiconductor light-emitting element, in the laminated semiconductor layer, the first conduction type of the first semiconductor layer is an n-type in which a carrier is an electron and the second conduction type of the second semiconductor layer is a p-type in which a carrier is a hole.

According to an eighth aspect of the present invention, the semiconductor light-emitting element of the first aspect further includes a first connector used for electrically connecting the first electrode to an outside and a second connector used for electrically connecting the second electrode to the outside.

According to a ninth aspect of the present invention, a semiconductor light-emitting device includes: a semiconductor light-emitting element; and a circuit board on which the semiconductor light-emitting element is mounted, the semiconductor light-emitting element including: a laminated semiconductor layer in which an n-type semiconductor layer, a light-emitting layer and a p-type semiconductor layer are laminated; a negative electrode that is connected to the n-type semiconductor layer; and a positive electrode that is provided on a surface of the p-type semiconductor layer, the positive electrode including: a transparent conductive layer having plural convex portions on a side thereof opposite to a side of the laminated semiconductor layer and containing indium; an insulation layer laminated on a side of the convex portion and composed of silicon dioxide having a refractive index lower than a refractive index of the transparent conductive layer; a metal reflecting layer laminated on the insulation layer and containing silver; and a conductor portion provided through the insulation layer, one end of which is electrically connected to one of the thick portions of the transparent conductive layer and the other end of which is electrically connected to the metal reflecting layer, the circuit board being arranged to face the positive electrode of the semiconductor light-emitting element.

According to a tenth aspect of the present invention, in the ninth aspect of the semiconductor light-emitting device, the circuit board includes a pair of wirings connected to the negative electrode and the positive electrode of the semiconductor light-emitting element through respective connectors.

According to the present invention, by providing a semiconductor light-emitting element including: a laminated semiconductor layer in which a first semiconductor layer having a first conduction type, a light-emitting layer and a second semiconductor layer having a second conduction type that is opposite to the first conduction type are laminated; a first electrode that is connected to the first semiconductor layer; and a second electrode that is provided on a surface of the second semiconductor layer, the second electrode including: a transparent conductive layer that includes plural thick portions thicker than other portions and has transparency to light emitted from the light-emitting layer; an insulation layer that is laminated on the transparent conductive layer and has a refractive index lower than a refractive index of the transparent conductive layer; a metal reflecting layer that is laminated on the insulation layer and has conductivity; and a conductor portion that is provided through the insulation layer, one end of which is electrically connected to one of the thick portions of the transparent conductive layer and the other end of which is electrically connected to the metal reflecting layer, light emission output (Po: in the unit of mW) of the semiconductor light-emitting element is increased.

In other words, by forming plural thick portions that are thicker than other portions in the transparent conductive layer and forming the other portions (base portion) to be thinner, the light emission output (Po: in the unit of mW) is increased while the rise of forward voltage (Vf) is suppressed compared to a semiconductor light-emitting element without having plural thick portions.

BRIEF DESCRIPTION OF THE DRAWINGS

Exemplary embodiments of the present invention will be described in detail based on the following figures, wherein:

FIGS. 7A to 7C are diagrams showing specific examples of patterns (isolation patterns) of a thick portion provided in a transparent conductive layer;

DETAILED DESCRIPTION

Hereinbelow, an exemplary embodiment according to the present invention will be described in detail. It should be noted that the present invention is not limited to the following exemplary embodiment, but may be practiced as various modifications within the scope of the gist of the invention.

Further, each of the figures to be used indicates a specific example for illustration of the exemplary embodiment, and does not represent an actual size thereof.

<Semiconductor Light-Emitting Device>

Figure 1:
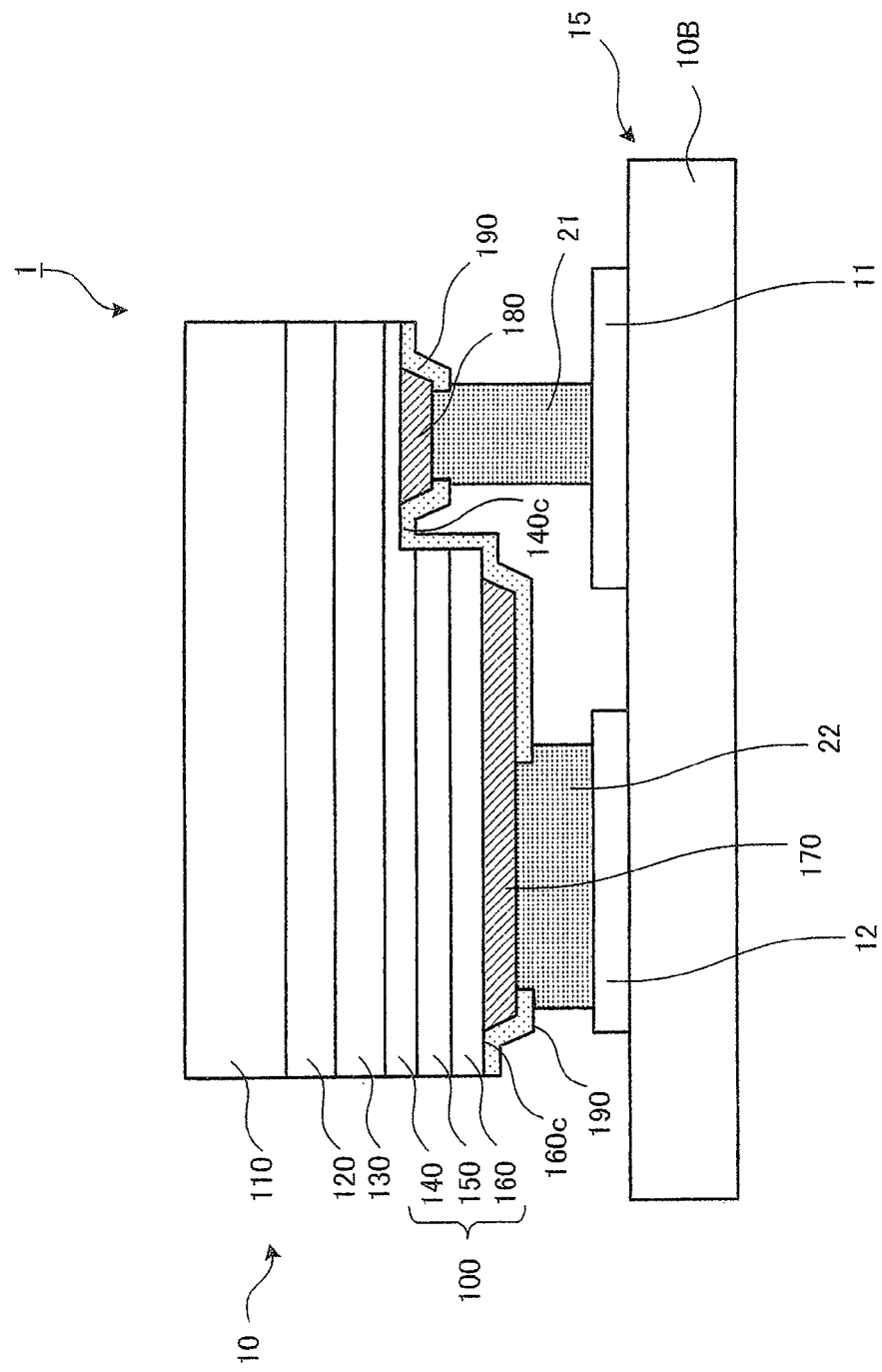
FIG. 1 is a diagram showing a specific example of a cross-sectional schematic view of a semiconductor light-emitting device to which the exemplary embodiment is applied.

FIG. 1 is a specific example of a cross-sectional schematic view of a semiconductor light-emitting device 1 to which the exemplary embodiment is applied. The semiconductor light-emitting device 1 includes a semiconductor light-emitting element 10 that emits light and a submount 15 as an example of a circuit board on which wirings for supplying electric power to the semiconductor light-emitting element 10 are provided and to which the semiconductor light-emitting element 10 is secured.

The semiconductor light-emitting element 10 includes: a substrate 110; an intermediate layer 120; a base layer 130; and a laminated semiconductor layer 100. The semiconductor light-emitting element 10 also includes, as an example of a pair of positive and negative connecting electrodes, a first electrode 180 working as a negative electrode and a second electrode 170 working as a positive electrode. As will be described later, the laminated semiconductor layer 100 is configured with an n-type semiconductor layer 140, a light-emitting layer 150 and a p-type semiconductor layer 160. It should be noted that the first electrode 180 is provided to a portion where a part of the laminated semiconductor layer 100 is cutout.

There is provided a protecting layer 190 that covers top and side surfaces of the intermediate layer 120, the base layer 130 and the laminated semiconductor layer 100 except for a part of top surfaces of the first electrode 180 and the second electrode 170.

It should be noted that details of the semiconductor light-emitting element 10 will be described later.

The submount 15 includes: a submount substrate 10B; submount wirings 11 and 12 that are provided on the submount substrate 10B; and bumps 21 and 22 as an example of a connector that electrically connects the first electrode 180 and the second electrode 170 of the semiconductor light-emitting element 10 with the submount wirings 11 and 12, respectively.

In FIG. 1, the substrate 110 is located on an upper side of the semiconductor light-emitting element 10. That is, the semiconductor light-emitting element 10 is reversed and mounted on the submount 15. To reverse and mount the semiconductor light-emitting element 10 on the submount 15 in this manner is referred to as flip-chip (FC) mounting or flip-chip (FC) bonding. This mounting system is also referred to as face-down (FD) mounting since the semiconductor light-emitting element 10 is reversed to be mounted.

Description will be provided on light extraction in the exemplary embodiment. Of the light emitted from the laminated semiconductor layer 100 (specifically, the light-emitting layer 150 in FIG. 2, which will be described later) of the semiconductor light-emitting element 10, light traveling toward the substrate 110 is extracted to the outside (upper direction in FIG. 1). On the other hand, of the light emitted from the light-emitting layer 150, light traveling toward the second electrode 170 is reflected by a reflecting layer (an insulation layer 172 and a metal reflecting layer 173 shown in FIGS. 6A and 6B, which will be described later) that is provided on the second electrode 170 and shows light reflectivity to the light emitted from the light-emitting layer 150 and proceeds toward the substrate 110, and is extracted to the outside (upper direction in FIG. 1). There is also light extracted to the outside from the side surface of the laminated semiconductor layer 100, the intermediate layer 120 or the base layer 130. Hereinafter, description will be given to detailed configurations of the submount 15 and the semiconductor light-emitting element 10 in this order.
(Submount)

As the submount substrate 10B of the submount 15, various kinds of substrates which are insulative or conductive, such as a ceramic substrate, an AlN (aluminum nitride) substrate, an Al (aluminum) substrate, a Cu (cupper) substrate and a glass epoxy substrate can be selected and used without any particular limitations.

It should be noted that, in the case where the conductive substrate such as an Al substrate is used, at least one of the submount wirings 11 and 12 is provided via an insulating layer for electrically insulating the submount wirings 11 and 12 from the submount substrate 10B.

As the bumps 21 and 22 that connect the first electrode 180 and the second electrode 170 of the semiconductor light-emitting element 10 with the submount wirings 11 and 12 of the submount substrate 10B, respectively, Sn (tin)-added Au (Au—Sn alloy) balls or solder balls can be used, for example. Especially, an Au—Sn alloy with a heating temperature of about 300° C. in connecting (contact bonding) is preferred.

Hereinafter, detailed configuration of the semiconductor light-emitting element 10 will be described.
<Semiconductor Light-Emitting Element>

Figure 2:
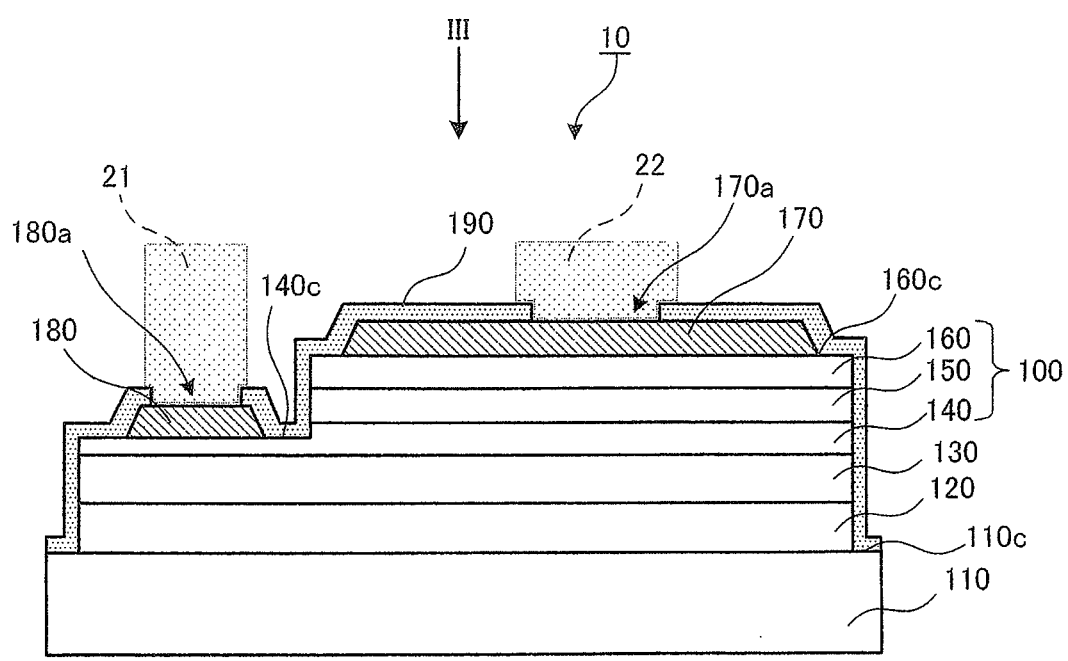
FIG. 2 is a specific example of a cross-sectional schematic view of a semiconductor light-emitting element.
Figure 3:
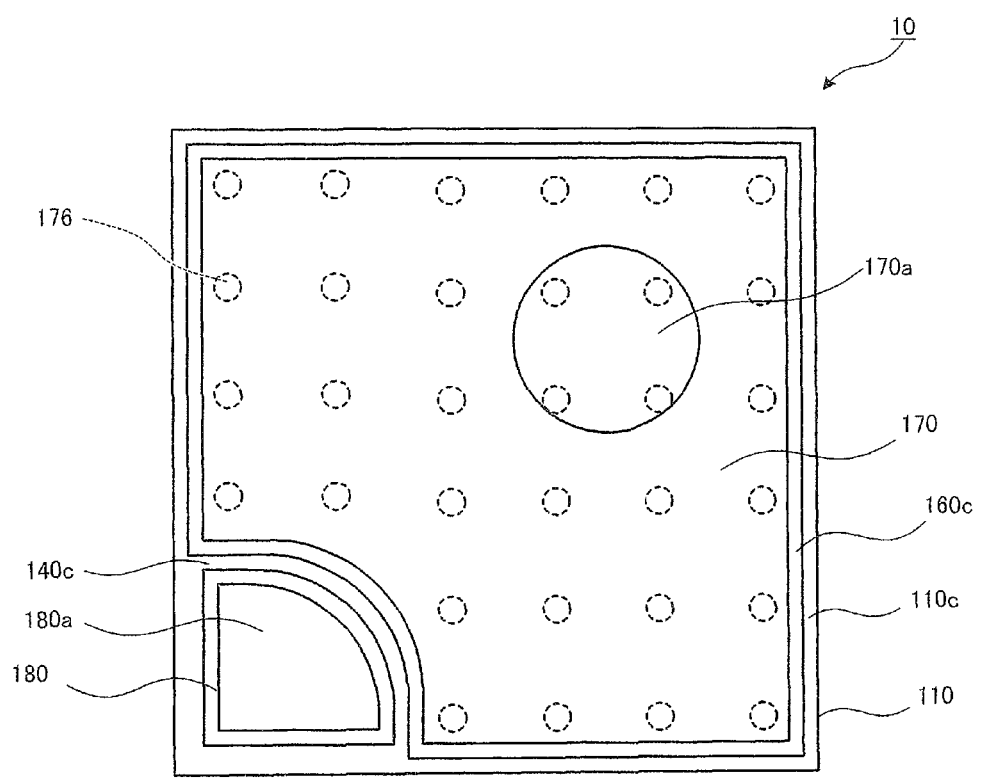
FIG. 3 is a specific example of a planar schematic view of the semiconductor light-emitting element.
Figure 4:
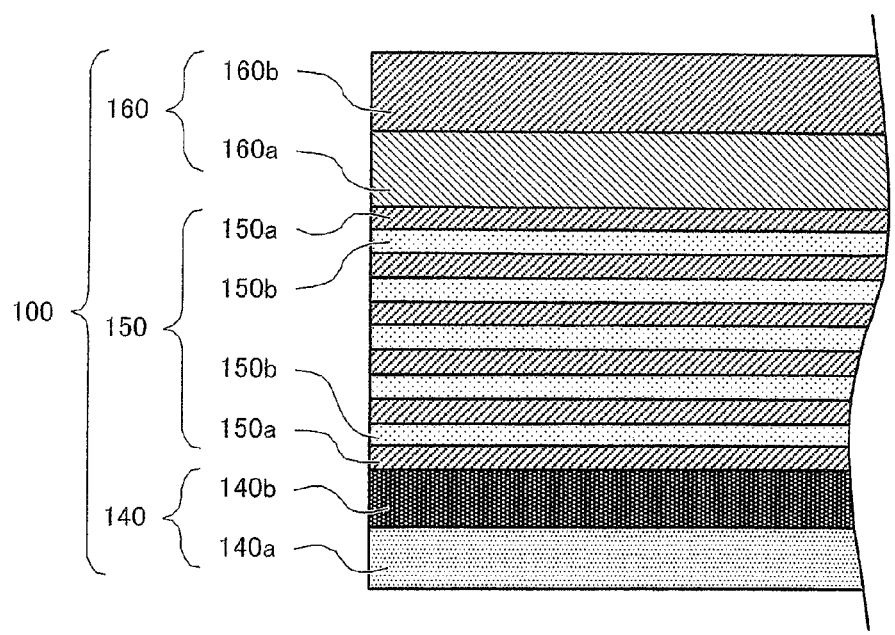
FIG. 4 is a specific example of a cross-sectional schematic view of a laminated semiconductor layer.

FIG. 2 is a specific example of a cross-sectional schematic view of the semiconductor light-emitting element. FIG. 3 is a specific example of a planar schematic view of the semiconductor light-emitting element as viewed from the direction III, as shown in FIG. 2. FIG. 4 is a specific example of a cross-sectional schematic view of the laminated semiconductor constituting the semiconductor light-emitting element.

As shown in FIG. 2, the semiconductor light-emitting element 10 includes: the substrate 110; the intermediate layer 120 laminated on the substrate 110; and the base layer 130 laminated on the intermediate layer 120. The semiconductor light-emitting element 10 also includes the laminated semiconductor layer 100 laminated on the base layer 130. The laminated semiconductor layer 100 is configured with, from the base layer 130 side: the n-type semiconductor layer 140 as a first semiconductor layer having a first conduction type; the light-emitting layer 150 laminated on the n-type semiconductor layer 140; and the p-type semiconductor layer 160 as a second semiconductor layer having a second conduction type, which is opposite to the first conduction type, that is laminated on the light-emitting layer 150.

Further, the semiconductor light-emitting element 10 includes the first electrode 180 formed on a semiconductor layer exposure surface 140c of the n-type semiconductor layer 140 exposed by cutting a part of the p-type semiconductor layer 160, the light-emitting layer 150 and the n-type semiconductor layer 140 as the first semiconductor layer that have been laminated, and the second electrode 170 formed on a top surface 160c of the p-type semiconductor layer 160 as the second semiconductor layer.

Furthermore, the semiconductor light-emitting element 10 includes the protecting layer 190 laminated on the first electrode 180 and the second electrode 170, as well as a part of the p-type semiconductor layer 160, the light-emitting layer 150 and the n-type semiconductor layer (closer to the light-emitting layer 150 than the semiconductor layer exposure surface 140c). The protecting layer 190 is formed to cover all over the side wall surface of a part of the p-type semiconductor layer 160, the light-emitting layer 150 and the n-type semiconductor layer 140 (closer to the light-emitting layer 150 than the semiconductor layer exposure surface 140c) and a top surface 110c of a part of the substrate 110.

In the first electrode 180, a part of the surface located on an upper side in FIG. 2 is exposed and a first opening portion 180a used for electrically connecting to the outside by the bump 21 (first connector), as will be described later, is formed. In similar way, in the second electrode 170, a part of the surface located on an upper side in FIG. 2 is exposed and a second opening portion 170a used for electrically connecting to the outside by the bump 22 (second connector), as will be described later, is formed.

The semiconductor light-emitting element 10 of the exemplary embodiment 10 has a configuration in which the first electrode 180 and the second electrode 170 are formed on a surface that is on an opposite side of the substrate 110. In the semiconductor light-emitting element 10, the first electrode 180 and the second electrode 170 are supposed to be the negative electrode and the positive electrode, respectively, and the light-emitting layer 150 emits light by passing a current through the laminated semiconductor layer 100 (more specifically, the p-type semiconductor layer 160, the light-emitting layer 150 and the n-type semiconductor layer 140) via these electrodes.

Next, as shown in FIG. 3, in a planar view (a planar schematic view of the semiconductor light-emitting element 10 shown in FIG. 2 as viewed from the direction III), the first electrode 180 is formed at a portion in the proximity of one corner of the substrate 110 having a square planar shape. The first electrode 180 is formed on the semiconductor layer exposure surface 140c having been exposed, and further, on the top surface of the first electrode 180, the first opening portion 180a used for electrically connecting to the outside is formed.

The second electrode 170 is formed to cover almost all of the top surface 160c of the p-type semiconductor layer 160 except for a part removed by etching or the like to form the first electrode 180. On the top surface of the second electrode 170, the second opening portion 170a for exposing the second electrode 170, which is used to electrically connect to the outside, is formed. Further, as will be described later, plural conductor portions 176 for electrically connecting the thick portion provided in the transparent conductive layer constituting the second electrode 170 with the metal reflecting layer are provided. It should be noted that, in FIG. 3, the protecting layer 190 that covers the first electrode 180 and the second electrode 170 is omitted.

Next, each layer of the semiconductor light-emitting element 10 will be described.
(Substrate)

As the substrate 110, there is no particular limitation on any substrate as long as group III nitride semiconductor crystals are epitaxially grown on a surface thereof, and accordingly, various kinds of substrate may be selected and used. However, as will be described later, since the semiconductor light-emitting element 10 of the exemplary embodiment is flip-chip mounted so that the light is extracted from the substrate 110 side, it is preferable to have transparency to the light emitted from the light-emitting layer 150. Accordingly, the substrate 110 composed of, for example, sapphire, zinc oxide, magnesium oxide, zirconium oxide, magnesium-aluminum oxide, gallium oxide, indium oxide, lithium-gallium oxide, lithium-aluminum oxide, neodium-gallium oxide, lanthanum-strontium-aluminum-tantalum oxide, strontium-titanium oxide, titanium oxide and the like can be used.

Among the above-described materials, it is preferable to use sapphire in which C-face is a principal surface as the substrate 110. In the case where the sapphire is used as the substrate 110, the intermediate layer 120 (buffer layer) may be formed on the C-face of the sapphire.

(Laminated Semiconductor Layer)

The laminated semiconductor layer 100 is composed of, for example, a group III nitride semiconductor, which is configured by laminating the n-type semiconductor layer 140, the light-emitting layer 150 and the p-type semiconductor layer 160 on the substrate 110 in this order, as shown in FIG. 2. Further, as shown in FIG. 4, each of the n-type semiconductor layer 140, the light-emitting layer 150 and the p-type semiconductor layer 160 may be configured by plural semiconductor layers. The laminated semiconductor layer 100 may further includes the base layer 130 and the intermediate layer 120. Here, the n-type semiconductor layer 140 performs electrical conduction of a first conduction type in which an electron is a carrier, while the p-type semiconductor layer 160 performs electrical conduction of a second conduction type in which a hole is a carrier.

It should be noted that the laminated semiconductor layer 100 with excellent crystallinity can be obtained by forming by an MOCVD method, however, a sputtering method under optimized conditions can form the laminated semiconductor layer 100 having more excellent crystallinity than that formed by the MOCVD method. Hereinafter, descriptions will be sequentially given.

<Intermediate Layer>

The intermediate layer 120 is preferably composed of polycrystal $Al_xGa_{1-x}N$ ($0 \leq x \leq 1$), and more preferably, composed of single crystal $Al_xGa_{1-x}N$ ($0 \leq x \leq 1$).

The intermediate layer 120 can be, for example, composed of polycrystal $Al_xGa_{1-x}N$ ($0 \leq x \leq 1$) with a thickness of 0.01 µm to 0.5 µm. If the thickness of the intermediate layer 120 is less than 0.01 µm, there are some cases where an effect of the intermediate layer 120 to mediate the difference in lattice constant between the substrate 110 and the base layer 130 cannot be sufficiently obtained. On the other hand, if the thickness of the intermediate layer 120 is more than 0.5 µm, there is a possibility that the time of forming process of the intermediate layer 120 becomes longer though there is no change to the function of the intermediate layer 120, and accordingly the productivity is decreased.

The intermediate layer 120 has a function of mediating the difference in lattice constant between the substrate 110 and the base layer 130 to facilitate the formation of a single crystal layer which is C-axis oriented on the (0001) surface (C-face) of the substrate 110. Consequently, on the intermediate layer 120, the base layer 130 having more excellent crystallinity can be laminated. It should be noted that it is preferable to form the intermediate layer 120 in the present invention, but the intermediate layer 120 is not necessarily formed.

Further, the intermediate layer 120 may have a crystal structure of a hexagonal system composed of the group III nitride semiconductor. Moreover, as the crystal of the group III nitride semiconductor constituting the intermediate layer 120, the crystal having a single crystal structure is preferably used. Crystals of the group III nitride semiconductor grow not only in an upper direction but also in an in-plane direction to form a single crystal structure by controlling growing conditions. Accordingly, the intermediate layer 120 can be composed of the group III nitride semiconductor crystals having single crystal structure by controlling layer forming conditions of the intermediate layer 120. In the case where the intermediate layer 120 having such a single crystal structure is formed on the substrate 110, the buffer function of the intermediate layer 120 effectively works, and thereby the group III nitride semiconductor formed thereon becomes a crystal film having excellent orientation property and crystallinity.

(Base Layer)

As the base layer 130, $Al_xGa_yIn_zN$ ($0 \leq x \leq 1$, $0 \leq y \leq 1$, $0 \leq z \leq 1$, $x+y+z=1$) can be used, but it is preferable to use $Al_xGa_{1-x}N$ ($0 \leq x < 1$) because the base layer 130 with excellent crystallinity can be formed.

The thickness of the base layer 130 is preferably 0.1 µm or more, more preferably 0.5 µm or more, and most preferably 1 µm or more. The $Al_xGa_{1-x}N$ layer having excellent crystallinity is likely to be obtained with these layer thickness or more. Further, in terms of production cost, the thickness of the base layer 130 is preferably 15 µm or less, and more preferably 10 µm or less.

To improve the crystallinity of the base layer 130, it is desirable that the base layer 130 is not doped with impurities. However, if conductivity of p-type or n-type is needed, acceptor impurities or donor impurities can be added.

(N-Type Semiconductor Layer)

As shown in FIG. 4, the n-type semiconductor layer 140, in which, for example, an electron is a carrier as an example of the first semiconductor layer, is preferably configured with an n-contact layer 140a and an n-cladding layer 140b. It should be noted that the n-contact layer 140a can also serve as the n-cladding layer 140b. Further, the above-described base layer 130 may be included in the n-type semiconductor layer 140.

The n-contact layer 140a is a layer for providing the first electrode 180. The n-contact layer 140a is preferably configured with the $Al_xGa_{1-x}N$ layer ($0 \leq x < 1$, preferably $0 \leq x \leq 0.5$, and more preferably $0 \leq x \leq 0.1$).

Further, the n-contact layer 140a is preferably doped with n-type impurities, and preferably contains the n-type impurities having a density of $1 \times 10^{17}/cm^3$ to $1 \times 10^{20}/cm^3$, and preferably a density of $1 \times 10^{18}/cm^3$ to $1 \times 10^{19}/cm^3$ on the point that a good ohmic contact with the first electrode 180 can be maintained. The n-type impurities are not particularly limited, however, Si, Ge, Sn and so on are provided, and Si and Ge are preferably provided.

The thickness of the n-contact layer 140a is preferably set to 0.5 µm to 5 µm, and more preferably set in a range of 1 µm to 3 µm. If the thickness of the n-contact layer 140a is in the above-described ranges, crystallinity of the semiconductor is suitably maintained.

It is preferable to provide the n-cladding layer 140b between the n-contact layer 140a and the light-emitting layer 150. The n-cladding layer 140b performs injection of the carriers into the light-emitting layer 150 and confinement of the carriers. The n-cladding layer 140b can be formed of AlGaN, GaN, GaInN and so on. It should be noted that, in this specification, materials are referred to as, for example, AlGaN or GaInN with the compositional ratio of each element omitted. Further, the hetero junction structure or the superlattice structure in which the layer is laminated plural times of these structures may also be used. When the n-cladding layer 140b is formed of GaInN, the band gap thereof is preferably larger than that of GaInN of the light-emitting layer 150.

The thickness of the n-cladding layer 140b is not particularly limited, but preferably in a range of 0.005 µm to 0.5 µm, and more preferably in a range of 0.005 µm to 0.1 µm. The n-type doping concentration of the n-cladding layer 140b is preferably in a range of $1 \times 10^{17}/cm^3$ to $1 \times 10^{20}/cm^3$, and more preferably in a range of $1 \times 10^{18}/cm^3$ to $1 \times 10^{19}/cm^3$. It is preferable to provide the doping concentration in these ranges in terms of maintaining excellent crystallinity and reducing operation voltage of the light-emitting element.

It should be noted that, in the case where the n-cladding layer 140b is a layer containing the superlattice structure, the layer may contain a structure in which an n-side first layer composed of the group III nitride semiconductor with a thickness of 100 angstrom or less and an n-side second layer having a different composition from the n-side first layer and composed of the group III nitride semiconductor with a thickness of 100 angstrom or less are laminated, though detailed illustration is omitted. Further, the n-cladding layer 140b may contain a structure in which the n-side first layers and the n-side second layers are alternately and repeatedly laminated, and the structure is preferably an alternating structure of GaInN and GaN or an alternating structure of GaInN having different compositions.

(Light-Emitting Layer)

As the light-emitting layer 150 laminated on the n-type semiconductor layer 140, a single quantum well structure or a multiple quantum well structure can be employed.

As a well layer 150b having a quantum well structure as shown in FIG. 4, the group III nitride semiconductor layer composed of $Ga_{1-y}In_yN$ (0<y<0.4) is usually used. The thickness of the well layer 150b may be the thickness by which quantum effects can be obtained, for example, 1 nm to 10 nm, and preferably 2 nm to 6 nm in terms of light emission output.

Moreover, in the case of the light-emitting layer 150 having the multiple quantum well structure, the above-described $Ga_{1-y}In_yN$ is employed as the well layer 150b, and $Al_zGa_{1-z}N$ (0≦z<0.3) having a band gap energy larger than that of the well layer 150b is employed as a barrier layer 150a. The well layer 150b and the barrier layer 150a may be doped or not doped with impurities depending upon a design thereof.

It should be noted that, in the exemplary embodiment, the light-emitting layer 150 is configured to output blue light (light emission wavelength of the order of λ=400 nm to 465 nm).

(P-Type Semiconductor Layer)

As shown in FIG. 4, the p-type semiconductor layer 160, in which, for example, a hole is a carrier as an example of the second semiconductor layer, is usually configured with a p-cladding layer 160a and a p-contact layer 160b. Further, the p-contact layer 160b can also serve as the p-cladding layer 160a.

The p-cladding layer 160a performs confinement of carriers within the light-emitting layer 150 and injection of carriers. The p-cladding layer 160a is not particularly limited as long as the band gap energy of the composition thereof is larger than that of the light-emitting layer 150 and carriers can be confined within the light-emitting layer 150, but is preferably composed of $Al_xGa_{1-x}N$ (0<x≦0.4).

It is preferable that the p-cladding layer 160a is composed of such AlGaN in terms of confinement of carriers within the light-emitting layer 150. The thickness of the p-cladding layer 160a is not particularly limited, but preferably 1 nm to 400 nm, and more preferably 5 nm to 100 nm.

The p-type doping concentration of the p-cladding layer 160a is preferably $1×10^{18}/cm^3$ to $1×10^{21}/cm^3$, and more preferably $1×10^{19}/cm^3$ to $1×10^{20}/cm^3$. If the p-type doping concentration is in the above ranges, excellent p-type crystals can be obtained without deteriorating crystallinity.

Further, the p-cladding layer 160a may have a superlattice structure in which the layer is laminated plural times of these structures, and preferably has an alternating structure of AlGaN and AlGaN or an alternating structure of AlGaN and GaN.

The p-contact layer 160b is a layer for providing the second electrode 170. The p-contact layer 160b is preferably composed of $Al_xGa_{1-x}N$ (0≦x≦0.4). It is preferable that Al composition is in the above-described range in terms of allowing to maintain excellent crystallinity and good ohmic contact with the second electrode 170.

It is preferable to contain p-type impurities (dopants) in a concentration of $1×10^{18}/cm^3$ to $1×10^{21}/cm^3$, and preferably $5×10^{19}/cm^3$ to $5×10^{20}/cm^3$ in terms of maintaining good ohmic contact, preventing cracking and maintaining excellent crystallinity. The p-type impurities are not particularly limited, but, for example, Mg is preferably provided.

The thickness of the p-contact layer 160b is not particularly limited, but is preferably 10 nm to 500 nm, and more preferably 50 nm to 200 nm. It is preferable to provide the thickness of the p-contact layer 160b in these ranges in terms of light emission output.

(First Electrode)

Figure 5:
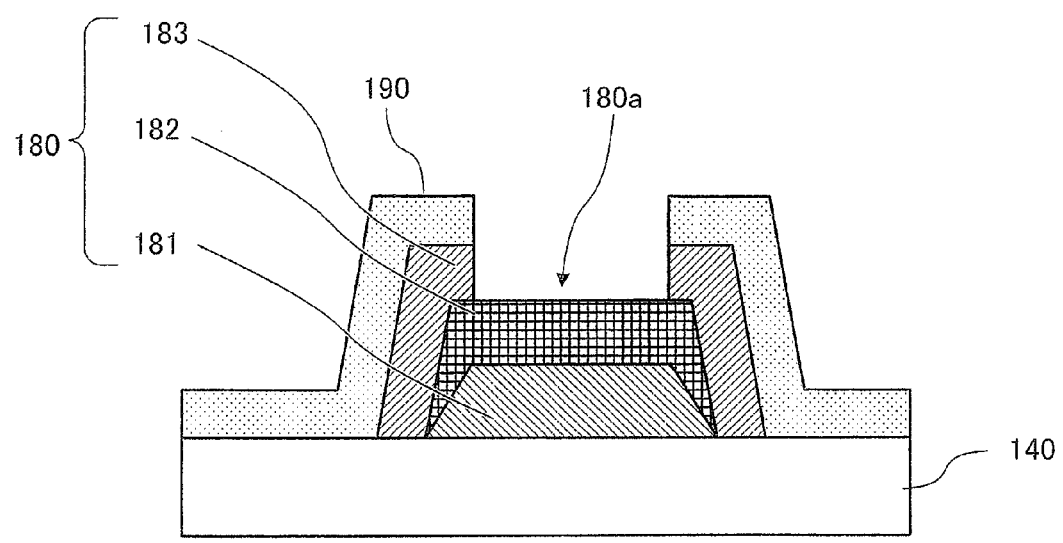
FIG. 5 is a specific example of a cross-sectional schematic view of a first electrode.

FIG. 5 is a specific example of a cross-sectional schematic view of a first electrode 180.

The first electrode 180 includes, for example: a first conductive layer 181 laminated on the semiconductor layer exposure surface 140c of the n-type semiconductor layer 140; a first bonding layer 182 laminated on the first conductive layer 181; and a first adhesive layer 183 that is provided to cover the above-described first bonding layer 182 except for a first opening portion 180a, which is an exposure portion of the first bonding layer 182. On a surface of the first adhesive layer 183 opposite to the surface facing the first bonding layer 182, the protecting layer 190 is laminated.

(First Conductive Layer)

As shown in FIG. 5, the first conductive layer 181 is laminated on the n-type semiconductor layer 140. As described above, in a planar view, a part of the first conductive layer 181 (refer to FIG. 3) has a semi-circular outline. The center portion of the first conductive layer 181 has a constant thickness and is formed substantially flat on the semiconductor layer exposure surface 140c (refer to FIG. 2), whereas, the end portion of the first conductive layer 181 is formed to be inclined to the semiconductor layer exposure surface 140c (refer to FIG. 2) due to gradual reduction of the thickness thereof. However, the first conductive layer 181 is not limited to such a shape, but may be formed in lattice patterns or tree patterns with some spaces in between, further, may have a rectangular cross section, and still further, may have an outline other than the circular shape.

As the first conductive layer 181, it is preferable to use one that is able to make an ohmic contact with the n-type semiconductor layer 140 and has low contact resistance with the n-type semiconductor layer 140.

In the exemplary embodiment, as the first conductive layer 181, for example, Al (aluminum), Ti/Al, Ta/Al, amorphous IZO/Al or the like is used. Similar to Ag (silver) constituting the metal reflecting layer 173 (refer to FIGS. 6A and 6B) of the second electrode 170, which will be described later, Al (aluminum) constituting the first conductive layer 181 has high light reflectivity to the light of the wavelength in the region of blue to green emitted from the light-emitting layer 150, and is thus able to function as a metal reflecting layer. The thickness of the first conductive layer 181 is usually provided in the range of 1 nm to 300 nm.

(First Bonding Layer)

As shown in FIG. 5, the first bonding layer 182 is laminated on the first conductive layer 181. The first bonding layer 182 is formed to cover all over the first conductive layer 181. The center portion of the first bonding layer 182 has a constant thickness and is formed substantially flat, whereas, the end portion of the first bonding layer 182 is formed to be inclined to the semiconductor layer exposure surface 140c (refer to FIG. 2) of the n-type semiconductor layer 140 due to gradual reduction of the thickness thereof.

Similar to a second bonding layer 174, which will be described later, the first bonding layer 182 includes at least one metal layer that is in contact with the first conductive layer 181. As the metal layer as a surface layer on an outermost side (first bonding layer 182), for example, Au (gold) is used. Further, the thickness of the entire first bonding layer 182 is preferably set in the range of 50 nm to 8000 nm. It should be noted that the first bonding layer 182 may have a laminated structure of plural metal layers.

(First Adhesive Layer)

As shown in FIG. 5, the first adhesive layer 183 is laminated on the first bonding layer 182. The first adhesive layer 183 is formed to cover the region of the first bonding layer 182 except for the exposed portion thereof. The center portion of the first adhesive layer 183 has a constant thickness and is formed substantially flat, whereas, the end portion of the first adhesive layer 183 is formed to be inclined to the semiconductor layer exposure surface 140c (refer to FIG. 2) of the n-type semiconductor layer 140. The end portion of the side surface side of the first adhesive layer 183 is provided to contact the semiconductor layer exposure surface 140c (refer to FIG. 2) of the n-type semiconductor layer 140.

The first adhesive layer 183 is provided to improve physical adhesive properties between the first bonding layer 182 configured with Au (gold) and the protecting layer 190. In the exemplary embodiment, the first adhesive layer 183 is made of Ti (titanium). However, other than Ti, it is possible to use, for example, Ta (tantalum) or Ni (nickel) as the first adhesive layer 183. The thickness of the first adhesive layer 183 is preferably in the range of 1 nm to 50 nm. If the thickness is excessively small, the adhesive properties with the protecting layer 190 or bonding layers 175 and 182 are apt to be deteriorated. If the thickness is excessively large, an influence is exerted upon production costs; therefore, it is unfavorable.

(Second Electrode)

Figures 6A, 6B:
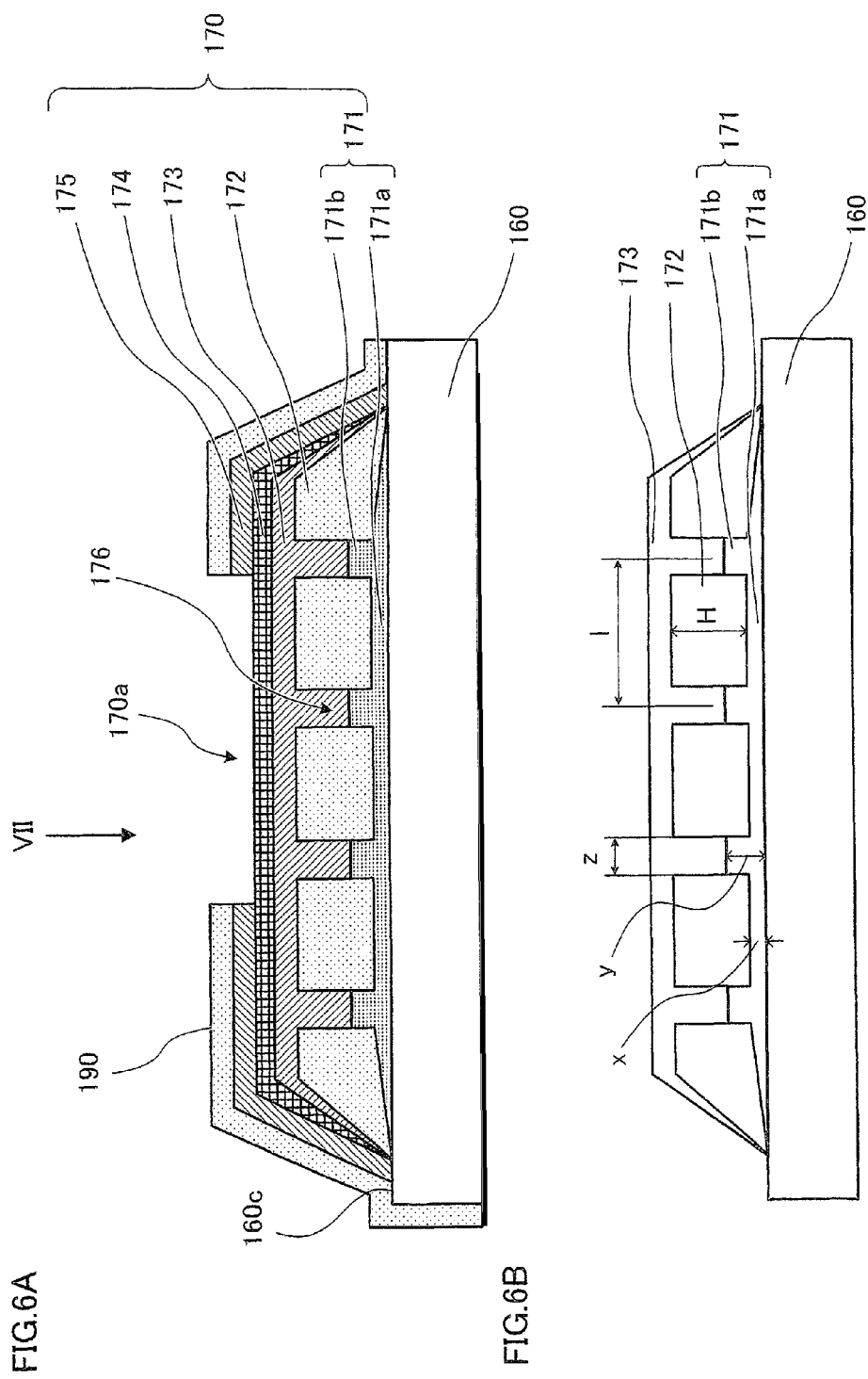
FIGS. 6A and 6B show a specific example of cross-sectional schematic views of a second electrode.

Next, the configuration of the second electrode 170 will be described. FIG. 6A is a specific example of a cross-sectional schematic view of the second electrode 170. FIG. 6B illustrates a main part of the second electrode 170.

As shown in FIG. 6A, the second electrode 170 includes: a transparent conductive layer 171 laminated on the top surface 160c of the p-type semiconductor layer 160 as a second semiconductor layer; an insulation layer 172 that is transparent and laminated on the transparent conductive layer 171 with a refractive index lower than that of the transparent conductive layer 171; a metal reflecting layer 173 that has conductivity and is laminated as a reflecting layer on the insulation layer 172; and conductor portions 176 that are formed through the insulation layer 172, one end of each of which is electrically connected to a convex portion 171b of the transparent conductive layer 171, and the other end of each of which is electrically connected to the metal reflecting layer 173. It should be noted that both of the metal reflecting layer 173 and the conductor portions 176 have a function as a reflecting layer. The second electrode 170 further includes a second bonding layer 174 laminated on the metal reflecting layer 173 and a second adhesive layer 175 provided to cover the second bonding layer 174 except for the second opening portion 170a, which is an exposing portion of the second bonding layer 174. Moreover, the protecting layer 190 is laminated on a surface of the second adhesive layer 175 opposite to the surface thereof facing the second bonding layer 174.

(Transparent Conductive Layer)

As shown in FIG. 6A, for forming the above-described second electrode 170, the transparent conductive layer 171 is formed on substantially all over but a circumferential portion of the top surface 160c of the p-type semiconductor layer 160, a part of which is removed by a known etching method or the like.

In the exemplary embodiment, the transparent conductive layer 171 is configured with a base portion 171a that is successive and covers the top surface of the p-type semiconductor layer 160 and plural convex portions 171b provided to face the insulation layer 172 opposite to the p-type semiconductor layer 160. The portion of the transparent conductive layer 171 in which the convex portions 171b are provided constitutes a thick portion which is thicker than other portions.

It should be noted that, though not shown in the figure, for constituting the thick portion without being limited to the exemplary embodiment, the convex portions 171b of the transparent conductive layer 171 may be provided to face the p-type semiconductor layer 160. In that case, the surface of the transparent conductive layer 171 facing the insulation layer 172 is formed to be flat.

As shown in FIG. 6B, in the exemplary embodiment, a thickness of the region in which the convex portions 171b of the transparent conductive layer 171 are not provided (referred to as a thickness (x) of the base portion 171a) can be selected from the range of 20 nm to 70 nm. Further, preferably, the thickness is selected from the range of 20 nm to 60 nm. For example, as reference data, the sheet resistance of the transparent conductive layer 171, composed of the base portion 171a without the convex portions 171b, having the thickness (x) is, though depending upon the manufacturing method thereof, infinite when the thickness is 10 nm, 250 Ω/sq when the thickness is 20 nm, 175 Ω/sq when the thickness is 25 nm, 72 Ω/sq when the thickness is 50 nm, 29 Ω/sq when the thickness is 100 nm, and 15 Ω/sq when the thickness is 200 nm.

If the thickness (x) of the base portion 171a is excessively thin, it becomes hard to make an ohmic contact with the p-type semiconductor layer 160, and the forward voltage (Vf) is apt to rise. If the thickness (x) of the base portion 171a is excessively thick, there is an unfavorable tendency in terms of light transparency to the light emitted from the light-emitting layer 150 and the reflected light from the metal reflecting layer 173.

It should be noted that, in the exemplary embodiment, the center portion of the base portion 171a has a constant thickness and is formed substantially flat with respect to the top surface 160c of the p-type semiconductor layer 160, whereas, the end portion of the base portion 171a is formed to be inclined to the top surface 160c of the p-type semiconductor layer 160 due to gradual reduction of the thickness thereof.

The thickness (y) of the thick portion in which the convex portions 171b are provided to the base portion 171a is, in the exemplary embodiment, selected from the range of 100 nm to 300 nm. Further, preferably, the thickness is selected from the range of 150 nm to 250 nm. In the case where the thickness (y) of the thick portion is excessively thin or excessively thick, there is an unfavorable tendency in terms of light transparency to the light emitted from the light-emitting layer 150 and the reflected light from the metal reflecting layer 173. It should be noted that, in the use in the FC mount technology, it is preferable to use the transparent conductive layer 171 as a thin film the thickness of which is not more than a specific thickness because of light absorption properties thereof.

The width (z) of the thick portion in which the convex portions 171b are provided to the base portion 171a is, in the exemplary embodiment, selected from the range of 10 μm to 30 μm. Further, preferably, the width is selected from the range of 15 μm to 25 μm. If the width (z) of the thick portion is excessively large, there is a tendency that the intensity of the light from the reflecting layer is affected by light absorption by the thick portion. If the width (z) of the thick portion is excessively small, the forward voltage (Vf) is raised. Moreover, if the width (z) of the thick portion is excessively small, alignment with through holes in the insulation layer 172 is apt to be difficult.

It should be noted that the cross-sectional shape of the thick portion including the convex portions 171*b* in a planar view is not particularly limited, and the shape may be circular, oval, triangular, square, rectangular, trapezoidal, pentagonal or other polygonal one (including star shape), wedge shape or the like. Further, the cross-sectional shape of the convex portion 171*b* in the vertical direction is not particularly limited, and the shape may be rectangular, trapezoidal, cone, pyramid, wedge or the like. Moreover, the thick portion of the convex portion 171*b* may include a lattice pattern composed of straight line portions connecting the convex portions 171*b* having such a cross-sectional shape (described later). Still further, a planar cross-sectional area of the convex portions 171*b* is not particularly limited, and further, a planar cross sectional area of each of the plural convex portions 171*b* is same or different.

The plural thick portions in the transparent conductive layer 171 are provided at predetermined intervals (pitch 1). In the exemplary embodiment, pitch 1 is selected from the range of 10 μm to 120 μm. Further, preferably, pitch 1 is selected from the range of 20 μm to 100 μm. If pitch 1 is excessively large, proportion (A/B) of the thick portion provided with the convex portions 171*b* to the transparent conductive layer 171 is reduced, and thereby effect of the invention is reduced and there is a tendency that light emission intensity is not improved. If pitch 1 is excessively small, the aforementioned proportion (A/B) becomes large, and accordingly, there is a tendency that light emission intensity is not improved. In this regard, A is an area of the convex portions 171*b*, and B is an area of the base portion 171*a*. (A/B) is the ratio of the area (A) of the convex portions 171*b* to the area (B) of the base portion 171*a*.

As a material for constituting the transparent conductive layer 171, a conductive oxide material that transmits at least 80% of the order of light of wavelength emitted from the light-emitting layer 150 is used. For example, part of oxides containing In (indium) is preferable in the point that both optical transparency and conductivity are superior to other transparent conductive films. Specific examples of conductive oxides containing In include: ITO (indium tin oxide ($In_2O_3$—$SnO_2$)); IZO (indium zinc oxide ($In_2O_3$—$ZnO$)); IGO (indium gallium oxide ($In_2O_3$—$Ga_2O_3$)); and ICO (indium cerium oxide ($In_2O_3$—$CeO_2$)). It should be noted that a dopant such as fluorine may be added to these materials. Further, for example, as oxides not containing In, conductive materials such as carrier-doped $SnO_2$, $ZnO_2$ and $TiO_2$ may be employed. The transparent conductive layer 171 can be formed by providing these materials by any well-known method in this technical field. Moreover, there are some cases where thermal annealing is performed for improving transparency and further reducing resistance of the transparent conductive layer 171 after forming the transparent conductive layer 171.

In the exemplary embodiment, as the transparent conductive layer 171, those having a crystallized structure may be used. For example, in particular, a transparent material containing $In_2O_3$ crystals having a crystal structure of a hexagonal system or a bixbyite structure (for example, ITO or IZO) is preferable. Further, for example, in the case where IZO containing $In_2O_3$ crystals having a crystal structure of a hexagonal system is used, an amorphous IZO film that has an excellent etching property can be used and processed into a specific shape, and thereafter, by transferring the amorphous state into a structure containing crystals through a heat treatment or the like, processed into an electrode that is excellent in optical transparency than the amorphous IZO film.

Further, as the IZO film used for the transparent conductive layer 171, it is preferable to use a composition showing the lowest specific resistance. For example, a ZnO concentration in IZO is preferably 1% by mass to 20% by mass, more preferably in a range of 5% by mass to 15% by mass, and 10% by mass is especially preferred.

The heat treatment of the IZO film used for the transparent conductive layer 171 is desirably performed in an atmosphere not containing $O_2$, and as the atmosphere not containing $O_2$, an inert gas atmosphere such as $N_2$ atmosphere or a mixed gas atmosphere of $H_2$ and an inert gas such as $N_2$ can be provided, and accordingly, the $N_2$ atmosphere or the mixed gas atmosphere of $N_2$ and $H_2$ is desirable. It should be noted that, if the heat treatment of the IZO film is performed in the $N_2$ atmosphere or the mixed gas atmosphere of $N_2$ and $H_2$, it is possible, for example, to crystallize the IZO film into a film containing $In_2O_3$ crystals having a crystal structure of a hexagonal system and effectively reduce a sheet resistance of the IZO film.

The heat treatment temperature of the IZO film is preferably 500° C. to 1000° C. If the heat treatment temperature is excessively low, there is a tendency that the IZO film cannot be crystallized sufficiently and optical transparency of the IZO film is not sufficiently high. If the heat treatment temperature is excessively high, there is a tendency that the IZO film is crystallized but optical transparency thereof is not sufficiently high. Further, in that case, there is also a possibility of deteriorating the semiconductor layer provided below the IZO film.

In the case of crystallizing the IZO film in an amorphous state, differences in film forming conditions or heat treatment conditions result in a difference in a crystal structure in the IZO film. However, in the exemplary embodiment according to the present invention, in terms of adherability to other layers, the material of the transparent conductive layer 171 is not limited but a crystalline material is preferred, and in particular, in the case of crystalline IZO, IZO may contain $In_2O_3$ crystals having a bixbyite crystal structure or $In_2O_3$ crystals having a crystal structure of a hexagonal system. Particularly, IZO containing $In_2O_3$ crystals having a crystal structure of a hexagonal system is preferred.

Especially, the IZO film crystallized by the heat treatment shows better adhesion properties to the p-type semiconductor 160 than those of the IZO film in an amorphous state, thus being very effective in the exemplary embodiment according to the present invention. Moreover, since the resistance is reduced in the IZO film crystallized by the heat treatment compared to that in the IZO film in an amorphous state, the IZO film crystallized by the heat treatment is preferred in the point that the forward voltage (Vf) can be reduced when the semiconductor light-emitting element 10 is configured.

(Insulation Layer)

As shown in FIG. 6A, the insulation layer 172 is laminated on the transparent conductive layer 171 and has a function as a reflecting film that reflects the light emitted from the light-emitting layer 150 by combination with the metal reflecting layer 173. In the exemplary embodiment, as will be described later, the conductor portions 176 formed through the insulation layer 172 are provided.

The insulation layer 172 has transparency, of at least of the order of 90% and preferably 95% or more, to the light outputted from the light-emitting layer 150, a refractive index lower than that of the transparent conductive layer 171, and insulating properties. Specific examples of materials constituting the insulation layer 172 include: $SiO_2$ (silicon dioxide); $MgF_2$ (magnesium fluoride); $CaF_2$ (calcium fluoride); $Al_2O_3$ (aluminum oxide). In the exemplary embodiment, as the insulation layer 172, $SiO_2$ (silicon dioxide) having a refractive index $n_1$=1.48 (wavelength of 450 nm) is used. It should be noted that the refractive index $n_2$ of an IZO film constituting the transparent conductive layer 171 is 2.21 (wavelength of 450 nm).

In the exemplary embodiment, the thickness (H) of the insulation layer 172 is, in a relation with Q=($\lambda$/4n) defined by use of the refractive index n of the insulation layer 172 and the wavelength $\lambda$ (nm) of the light-emitting layer 150, set in a relation of formula (1) as shown below. However, A is an integer in formula (1). As described above, Q indicates a result of dividing the wavelength $\lambda$ (nm) of the light-emitting layer 150 by fourfold refractive index n of the reflecting index n of the insulation layer 172.

$$H = AQ \tag{1}$$

Further, it is preferable to set the thickness (H) of the insulation layer 172 based on the following formula (2). It is more preferable to set the thickness (H) in a range larger than 5$\lambda$/4n. In other words, it is more preferable to set the thickness (H) to 5Q or more. However, under the constraint of production costs, the thickness (H) is preferably 20Q (=(20$\lambda$/4n)) or less.

$$(5\lambda/4n) < H \tag{2}$$

In the exemplary embodiment, it is preferable to set the thickness (H) of the insulation layer 172 in the range exceeding (5$\lambda$/4n), namely, in the case of blue light of the wavelength of 450 nm, in the range of the thickness (H) exceeding 380 nm.

From experimental data of the inventors and simulation results, a conclusion that the light emission intensity is particularly increased with a thickness of H=an odd multiple of Q as a unit, such as 3Q, 5Q, 7Q, . . . is obtained, and a fact that the thickness such as 3Q, 5Q, 7Q and so forth is especially preferred and the output of the semiconductor light-emitting element 10 depends upon the thickness of the insulation layer 172 is ascertained. In the exemplary embodiment, the thickness (H) of the insulation layer 172 is particularly an odd multiple of Q as a unit, such as 3Q, 5Q, 7Q, . . . , and it is especially preferable that the thickness (H) is in the range of an odd multiple of Q±0.5Q.

More specifically, from the inventors' experiments, it is ascertained that the output of the semiconductor light-emitting element 10 is increased as Q is increased (the thickness of the insulation layer 172 is increased), and further, the light emission intensity is especially and effectively increased with the thickness of an odd multiple of Q as a unit, such as 3Q, 5Q, 7Q, . . . . From this, it is considered that, due to increase of the thickness of the insulation layer 172, phases of reflected light are overlapped and cause enhanced reflection between the p-type semiconductor layer 160 and the transparent conductive layer 171, between the transparent conductive layer 171 and the insulation layer 172, and between the insulation layer 172 and the metal reflecting layer 173, and as a result, the output of the semiconductor light-emitting element 10 is increased.

Figure 11:
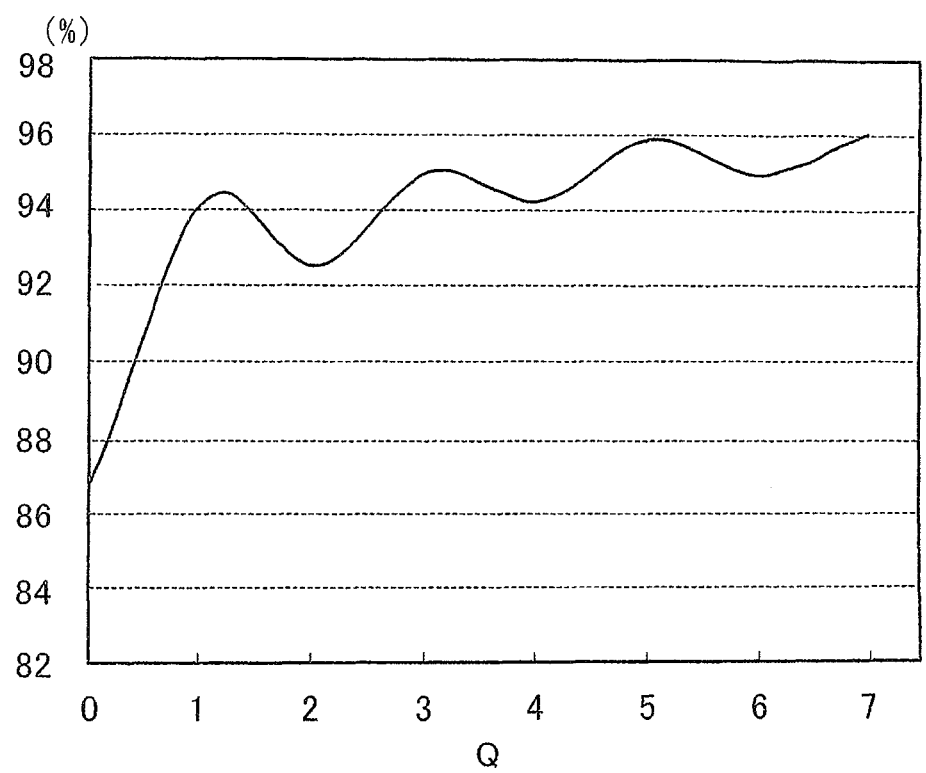
FIG. 11 shows a specific example of a result of simulated relationship indicating a relationship between thickness of an insulation layer and a reflectance.

Hereinafter, the present inventors performed a simulation about a relationship between the thickness of the insulation layer 172 and a reflectance in the case where Ag (silver) is employed as the metal reflecting layer 173 used in the second electrode 170. FIG. 11 shows a specific example of a result of simulated relationship indicating a relationship between the thickness of the insulation layer 172 and a reflectance. It should be noted that the horizontal axis in FIG. 11 indicates the thickness of the insulation layer 172 represented in units of Q as shown in the above formula (1), and the vertical axis indicates a reflectance of the configuration as described below.

First, simulation conditions will be described. GaN is used as the p-type semiconductor layer 160, and as the transparent conductive layer 171, an IZO layer having a thickness of 50 nm is formed on the p-type semiconductor layer 160. Next, as the insulation layer 172, an $SiO_2$ layer (thickness of 0Q to 7Q) is further formed on the transparent conductive layer 171. Then an Ag layer having a thickness of 150 nm is formed as the metal reflecting layer 173 on the insulation layer 172. Here, wavelength $\lambda$ of light emitted from the light-emitting layer 150 is 450 nm, and refractive indexes of the p-type semiconductor layer 160, the transparent conductive layer 170 and the insulation layer 172, each at $\lambda$=450 nm, are 2.44, 2.13 and 1.48, respectively.

As shown in FIG. 11, as a simulation result, a tendency to increase a reflectance due to providing the insulation layer 172 can be ascertained. This shows the same tendency as the result in the data of inventors' experiments in which the output Po is increased by providing the insulation layer 172.

Further, as shown in FIG. 11, it can be seen that the reflectance becomes high from around 3Q in the thickness of the insulation layer 172. Accordingly, under the present conditions, it can be considered that the output Po of the semiconductor light-emitting element 10 is increased by setting the thickness of the insulation layer 172 to 3Q or more.

Further, as shown in FIG. 11, it can be ascertained that the reflectance is stable in the range exceeding 5Q in the thickness of the insulation layer 172. Consequently, it can be considered that it is better to produce the semiconductor light-emitting element 10 in which the thickness of the insulation layer 172 exceeds 5Q for stably obtaining the semiconductor light-emitting element 10 in which the output Po is improved, and the same tendency as the result shown in the experimental data by the inventors has been ascertained also in this point.

(Metal Reflecting Layer)

As shown in FIG. 6A, the metal reflecting layer 173 is formed to cover all over the insulation layer 172. The center portion of the metal reflecting layer 173 has a constant thickness and is formed substantially flat, whereas, the end portion of the metal reflecting layer 173 is formed to be inclined to the top surface 160c of the p-type semiconductor layer 160 due to gradual reduction of the thickness thereof.

Specific examples of materials constituting the metal reflecting layer 173 include metals such as Ag (silver), Pd (palladium), Cu (cupper), Nd (neodymium), Al (aluminum), Ni (nickel) and Cr (chromium), and an alloy containing at least one of these metals. In particular, Ag (silver) or a silver alloy is preferable due to having high light reflectivity to light in blue to green wavelength regions emitted from the light-emitting layer 150. Further, since the metal reflecting layer 173 also has a function for feeding (hole injection) to the p-type semiconductor layer 160 through the conductor portions 176, which will be described later, and the transparent conductive layer 171, Ag (silver) or a silver alloy is a preferred material because Ag (silver) or a silver alloy is of low resistance. Moreover, by inserting an amorphous IZO film between the transparent conductive layer 171 and the metal reflecting layer 173, the contact resistance therebetween can be suppressed to be low.

In the exemplary embodiment, the thickness of the metal reflecting layer 173 is set to, for example, 100 nm. The thickness of the metal reflecting layer 173 can be selected preferably in a range of 90 nm or more to 150 nm or less, and more preferably in a range of 100 nm or more to 150 nm or less. If the thickness of the metal reflecting layer 173 is excessively thin, there is a tendency that reflective properties of light from the light-emitting layer 150 are deteriorated. Further, if the thickness of the metal reflecting layer 173 is excessively thick, rising of production costs is caused, and further, the difference in height between the metal reflecting layer 173 overcoated with the second bonding layer 174 or the like and the protecting layer 190 is increased to cause cracking, which will lead to decrease of reliability.

(Conductor Portions)

As shown in FIG. 6A, each of the plural conductor portions 176 is formed through the insulation layer 172, and provided so that one end of which is electrically connected to the convex portion 171b of the transparent conductive layer 171, and the other end of which is electrically connected to the metal reflecting layer 173. The plural conductor portions 176 are formed in the entire second electrode 170, and the current flowing through each conductor portion 176 is used for emission of the light-emitting layer 150. In the exemplary embodiment, the plural conductor portions 176 are provided for passing a current over the entire surface of the p-type semiconductor layer 160 through the top surface 160c, and thereby reducing unevenness in light emission.

The diameter of each conductor portion 176 is set in a range equal to the width (z) of the thick portion of the above-described transparent conductive layer 171 or smaller. In the exemplary embodiment, the diameter is selected from the range of 5 μm to 30 μm, and preferably, selected from the range of 5 μm to 20 μm. It should be noted that the cross-sectional shape of the conductor portion 176 in a planar view is not particularly limited, and the shape may be circular, oval, triangular, square, rectangular, trapezoidal, pentagonal or other polygonal one (including star shape), wedge shape or the like.

The conductor portions 176 can be formed by, for example, filling the through holes with a conductive material, the through holes being formed by a dry etching method, a lift-off method or the like in the insulation layer 172 laminated in advance. The conductor portions 176 are formed by use of at least one conductive material, or may be formed by use of plural conductive materials. Specific examples of conductive materials used for forming the conductor portions 176 include amorphous IZO, a silver alloy, Ta and Pt. In the exemplary embodiment, by providing the plural conductor portions 176 in the insulation layer 172, on the surface of the second electrode 170, a current is uniformly passed over the entire surface of the p-type semiconductor layer 160 through the transparent conductive layer 171. Consequently, it becomes possible to improve light emission unevenness in the light-emitting layer 150. The conductor portions 176 are provided to wall surfaces or bottom surfaces of the through holes formed by a dry etching method, a lift-off method or the like. Or, the conductor portions 176 may be formed by filling the through holes in the insulation layer 172 with a metal material.

(Second Bonding Layer)

As shown in FIG. 6A, on the top surface and side surface of the metal reflecting layer 173, the second bonding layer 174 is laminated to cover the metal reflecting layer 173. The second bonding layer 174 is formed to cover all over the metal reflecting layer 173. The center portion of the second bonding layer 174 has a constant thickness and is formed substantially flat. In the exemplary embodiment, the end portion of the second bonding layer 174 is formed to be inclined to the top surface 160c of the p-type semiconductor layer 160 due to gradual reduction of the thickness thereof.

The second bonding layer 174 as a connecting layer used to be electrically connected with the outside includes at least one metal layer on an innermost side to be in contact with the metal reflecting layer 173. Further, as a metal layer as a surface layer on an outermost side, for example, Au (gold) is used. Moreover, in the exemplary embodiment, the second bonding layer 174 may be formed of, for example, a two-layer structure (Ni/Au) constituted by an Ni (nickel) layer as a first layer formed in contact with the metal reflecting layer 173 and an Au layer formed outside of the Ni layer. Further, for example, a structure (Ta/Pt/Au) including a Ta (tantalum) layer as the first layer formed in contact with the metal reflecting layer 173, a Pt (platinum) layer as a second layer formed outside of the Ta layer and an Au (gold) layer as a third layer formed outside of the Pt layer and on an outermost side may be employed. Still further, a (Ti/Pt/Au) structure configured in the similar order may be employed. For example, in the case of Ta/Pt/Au structure, the structure may be used with a configuration in which the thickness of the Ta layer, the Pt layer and the Au layer are 300 nm, 100 nm and 550 nm, respectively.

The entire thickness of the second bonding layer 174 is not limited as long as the thickness is sufficient to have a function as a pad electrode when flip-chip mounting is performed, and in the exemplary embodiment, the thickness is preferably set to 50 nm to 8000 nm.

It should be noted that, in the case where the second bonding layer 174 is configured with plural metal layers, as the materials constituting the first layer formed in contact with the metal reflecting layer 173, for example, Ta (tantalum), Ti (titanium), an NiTi (nickel-titanium) alloy and a nitride thereof can be used other than above-described Ni (nickel).

(Second Adhesive Layer)

As shown in FIG. 6A, on the top surface and side surface of the second bonding layer 174, the second adhesive layer 175 is laminated. The second adhesive layer 175 is formed to cover the region of the second bonding layer 174 except for an exposed portion thereof. The center portion of the second adhesive layer 175 has a constant thickness and is formed substantially flat, whereas, the end portion of the second adhesive layer 175 is formed to be inclined to the top surface 160c of the p-type semiconductor layer 160. The end portion of the side surface side of the second adhesive layer 175 is provided to contact the top surface 160c of the p-type semiconductor layer 160.

The second adhesive layer 175 as an example of an adhesive layer is provided for improving physical adhesive properties between the second bonding layer 174 configured with Au (gold) and the protecting layer 190. In the exemplary embodiment, the second adhesive layer 175 is made of, for example, Ti (titanium). However, other than Ti, it is possible to use, for example, Ta (tantalum) or Ni (nickel) as the second adhesive layer 175.

It should be noted that, though not shown in the figure, the above-described characteristic configuration of the second electrode 170 can be applied to the aforementioned first electrode 180 formed on the semiconductor layer exposure surface 140c of the n-type semiconductor layer 140.

(Protecting Layer)

As shown in FIG. 5 or FIG. 6A, the protecting layer 190 composed of silicon oxide such as $SiO_2$ is laminated to cover the first electrode 180 and the second electrode 170 except for a part of each thereof, and also, cover a part of each of the p-type semiconductor layer 160, the light-emitting layer 150 and the n-type semiconductor layer 140 (a part closer to the light-emitting layer 150 than the semiconductor layer exposure surface 140c (refer to FIG. 2)). The protecting layer 190 is provided with a function as a protecting layer for suppressing intrusion of water or the like from the outside into the first electrode 180 and the second electrode 170, and a function as an auxiliary reflecting layer for reflecting light, which is among the light emitted from the light-emitting layer 150 that does not directly head for the substrate 110 and is not reflected by the metal reflecting layer 173 of the second electrode 170 or the first conductive layer 181 of the first electrode 180, toward the substrate 110. The thickness of the protecting layer 190 is usually provided in a range of 50 nm to 1 µm. If the thickness of the protecting layer 190 is excessively thin, there is a possibility of losing the function as the protecting layer, and besides, there is a tendency that the light emission output is reduced in a short period of time depending upon a use environment. Further, if the thickness of the protecting layer 190 is excessively thick, there is a tendency that the light emission output or the like is affected by light absorption.

(Bump)

The bumps (connectors) 21 and 22 shown in FIG. 1 are not limited to ball bumps or solder bumps formed in advance on the mounting substrate, but, for example, may be formed in advance in a protruding shape by a plating method or a deposition method on the first electrode 180 and the second electrode 170 on the semiconductor light-emitting element 10 side.

In the exemplary embodiment, the bumps can be produced on the semiconductor light-emitting element 10 side by these methods. Especially, since the bumps can be formed on every wafer by a photolithographic process, in a large-diameter wafer of 4 inches or more, there is an advantage of great reduction of the production load compared to formation of the bump balls on every mounting substrate.

(Planar Shape of Thick Portion)

FIGS. 7A to 7C are diagrams showing specific examples of patterns of a thick portion provided in a transparent conductive layer 171. In FIGS. 7A to 7C, planar schematic diagrams of the convex portions 171b, which are as viewed from the VII direction in the cross-sectional schematic diagram of the second electrode 170 shown in FIG. 6A, are shown. It should be noted that, in FIGS. 7A to 7C, the protecting layer 190 that covers the surface of each of the first electrode 180 and the second electrode 170 is omitted.

FIGS. 7A to 7C are diagrams showing isolation patterns of the thick portion. The shape of the convex portion 171b, which is provided in the base portion 171a so that the transparent conductive layer 171 has thick portions, is a circle having a predetermined diameter (ø=18 µm) in a planar view, for example. The plural convex portions 171b are provided over the entire surface of the base portion 171a at predetermined intervals (pitch 1). In a pair of adjacent rows, the convex portions 171b are arranged not to be aligned with the convex portions 171b in the adjacent row (provided in a staggered arrangement).

In FIG. 7A, pitch 1 among the plural convex portions 171b is 85 µm (pattern 1). In FIG. 7B, pitch 1 among the plural convex portions 171b is 71 µm (pattern 2). In FIG. 7C, pitch 1 among the plural convex portions 171b is 60 µm (pattern 3).

Figure 8A:
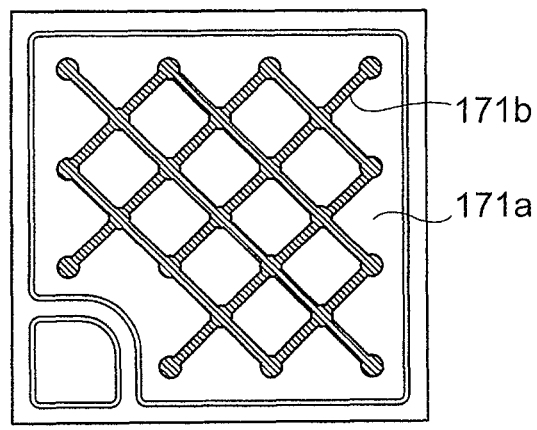
FIGS. 8A to 8C are diagrams showing specific examples of lattice patterns of the thick portion provided in the transparent conductive layer.
Figure 8B:
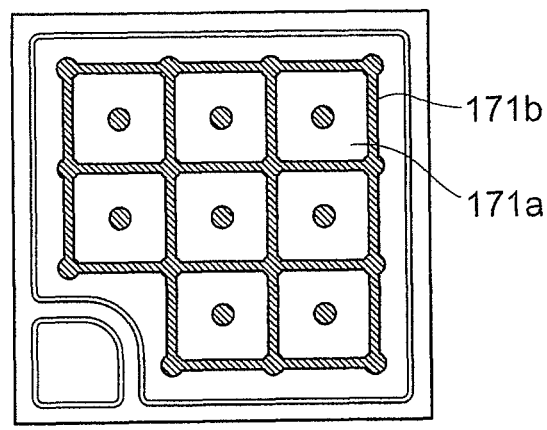
Figure 8C:
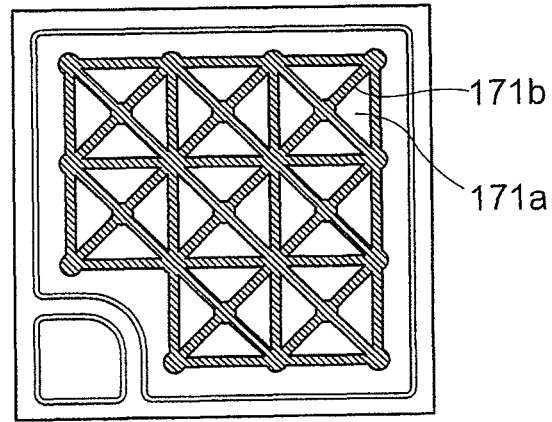

FIGS. 8A to 8C are diagrams showing specific examples of lattice patterns of a thick portion provided in a transparent conductive layer 171. The shape of the convex portions 171b, which constitutes the thick portion with the base portion 171a of the transparent conductive layer 171, has a lattice pattern composed of plural circular portions having a predetermined diameter (ø=90 µm) in a planar view and straight line portions that connect these circular portions. The thickness of the straight line portion is similar to that of the aforementioned convex portions 171b, and the width of the straight line portion is provided as same as the planar length of the aforementioned convex portions 171b (in the case where the convex portion has a circular shape, corresponds to the diameter) or less. In the present invention, the width is usually provided in a range of 5 µm to 18 µm.

In FIG. 8A, as the pattern of the thick portion, plural convex portions 171b whose cross-sectional shape is circular (ø=18 µm) are arranged at intervals of the pitch 1=84 µm as shown in aforementioned FIG. 7A (pattern 1), and these convex portions 171b are connected by the plural straight line portions to form a lattice pattern (pattern 4). In pattern 4, the straight line portion is formed to intersect one side of the base portion 171a of the transparent conductive layer 171 at an angle of approximately 45 degrees. In FIG. 8B, as the pattern of the thick portion, part of the plural convex portions 171b, which are circular (ø=18 µm), is left and other convex portions 171b are connected by plural straight line portions parallel to one side of the base portion 171a to form a lattice pattern (pattern 5). In FIG. 8C, as the pattern of the thick portion, pattern 4 shown in FIG. 8A and pattern 5 shown in FIG. 8B are combined to form a lattice pattern (pattern 6).

Figure 9A:
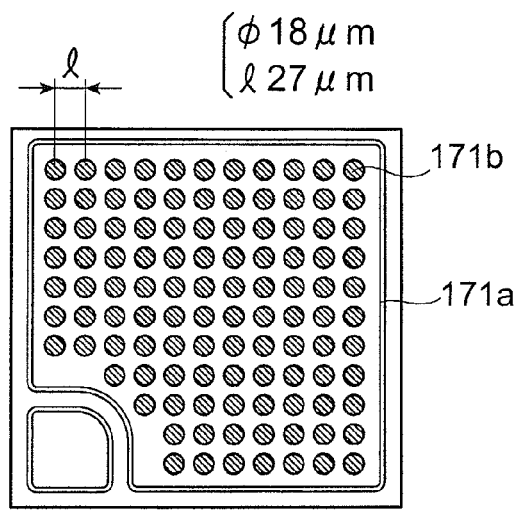
FIGS. 9A to 9C are diagrams showing specific examples of other isolation patterns of the thick portion provided in the transparent conductive layer.
Figure 9B:
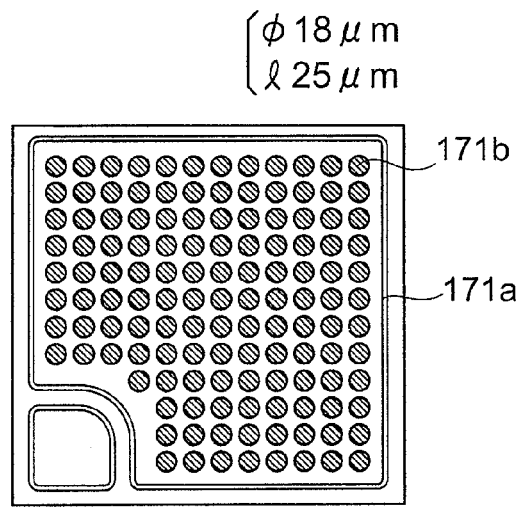
Figure 9C:
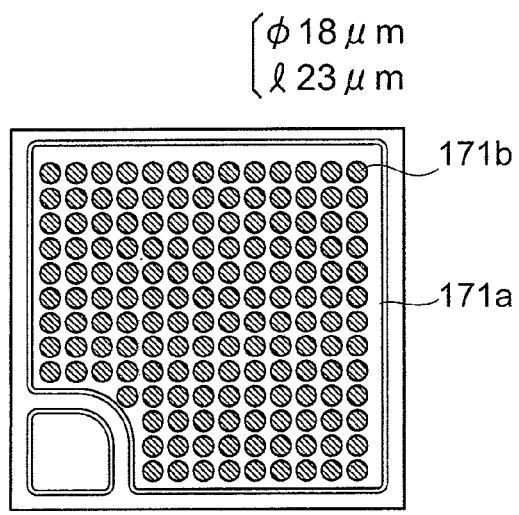

FIGS. 9A to 9C are diagrams showing other specific examples of isolation patterns of the thick portion provided in the transparent conductive layer 171. As described above, the shape of the convex portion 171b provided on the base portion 171a is a circle having a predetermined diameter (ø=18 µm) in a planar view. The plural convex portions 171b are provided all over the base portion 171a at predetermined intervals (pitch 1). In a pair of adjacent rows, the convex portions 171b are arranged at positions aligned with the convex portions 171b in the adjacent row.

In FIG. 9A, pitch 1 between the plural convex portions 171b is 27 µm (IZODOT II-(1)). In FIG. 9B, pitch 1 between the plural convex portions 171b is 25 µm (IZODOT II-(2)). In FIG. 9C, pitch 1 between the plural convex portions 171b is 23 µm (IZODOT II-(3)).

FIGS. 10A to 10D are diagrams showing other specific examples of patterns of the thick portion provided in the transparent conductive layer 171. In FIGS. 10A to 10D, the first electrode 180 of the semiconductor light-emitting element 10 is formed in the center portion of the n-type semiconductor layer 140. Therefore, the first opening portion 180a of the first electrode 180 is formed in the center portion of the base portion 171a of the transparent conductive layer 171.

The thick portion of the transparent conductive layer 171 is configured by arranging plural convex portions 171b at predetermined intervals on the base portion 171a of the transparent conductive layer 171 except for a portion where the first opening portion 180a is formed.

Figure 10A:
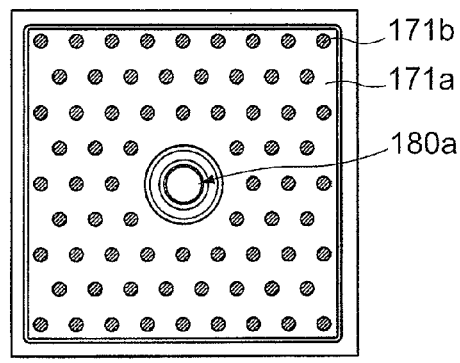
FIGS. 10A to 10D are diagrams showing specific examples of other patterns of the thick portion provided in the transparent conductive layer.

FIG. 10A shows an isolation pattern of the thick portion, in which the plural convex portions 171b are provided all over the base portion 171a at predetermined intervals, and in a pair of adjacent rows, provided in a staggered arrangement.

Figure 10B:
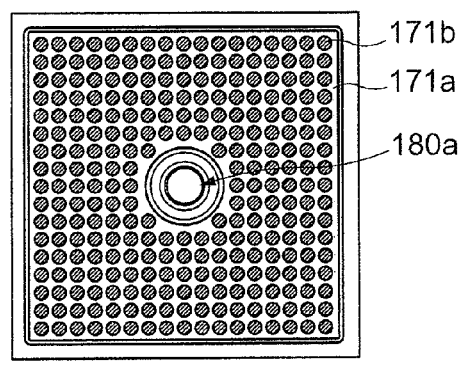

FIG. 10B shows another embodiment of the isolation pattern of the thick portion, in which the plural convex portions 171b are provided all over the base portion 171a at predetermined intervals, and in a pair of adjacent rows, arranged at positions aligned with the convex portions 171b in the adjacent row.

Figure 10C:
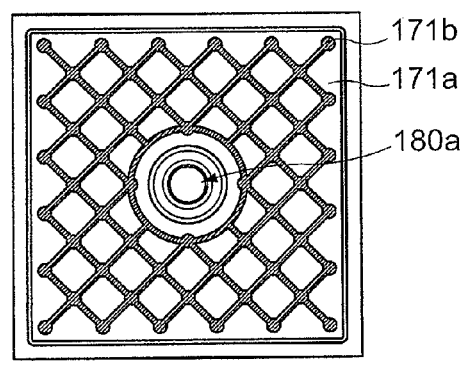

In FIG. 10C, the plural convex portions 171b are connected by the plural straight line portions to form a lattice pattern, and the straight line portions are formed to intersect one side of the base portion 171a of the transparent conductive layer 171 at an angle of approximately 45 degrees.

Figure 10D:
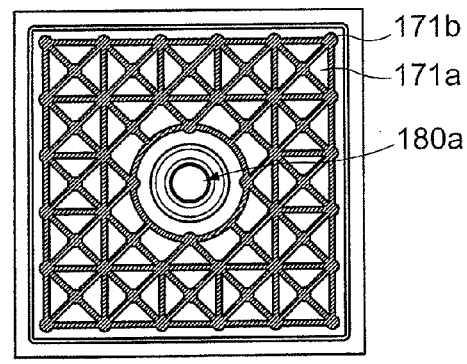

In FIG. 10D, a composite pattern is formed by combining a lattice pattern in which the convex portions 171b are connected by plural straight line portions parallel to one side of the base portion 171a and a lattice pattern, as shown in FIG. 10C, in which the straight line portions are formed to intersect one side of the base portion 171a of the transparent conductive layer 171 at an angle of approximately 45 degrees.

(Mounting Process onto Submount)

The semiconductor light-emitting element 10 shown in FIG. 1 is, for example, mounted on the submount substrate 10B through the following operations. First, a layer of TiW/Au is formed on an entire surface of the wafer of the semiconductor light-emitting element 10 by a known sputtering method, then, a resist in which the first opening portion 180a and the second opening portion 170a are opened by a known photolithographic technology is formed, and subsequent thereto, an Au layer having a predetermined thickness is grown on the first electrode 180 and the second electrode 170 by a known deposition method to form the bumps 21 and 22. Then, an Au—Sn film is formed on the bumps 21 and 22. A light emission chip is reversed and provided on the submount 15 using an AlN substrate, and the semiconductor light-emitting element 10 and the submount 15 are aligned so that the submount wirings 11 and 12 and the bumps 21 and 22 of the semiconductor light-emitting element 10 correspond with each other, and thus electrically connected.

EXAMPLES

Hereinafter, the present invention will be described further in detail with reference to examples. However, the present invention is not limited to the following examples as long as the scope of the gist thereof is not exceeded.

Example 1

In the semiconductor light-emitting element 10 shown in FIG. 2, the second electrodes 170 shown in FIG. 6A were prepared so that the patterns of the thick portions of the transparent conductive layers 171 made of IZO have the shapes of pattern 3 in FIG. 7C and pattern 4 in FIG. 8A. Here, two types of transparent conductive layers 171 were formed with the thicknesses (x) of the base portions 171a of 25 nm and 50 nm. The thickness (y) of the thick portion in each transparent conductive layer 171 is 200 nm. The shape of the convex portion 171b is a circle having a diameter (ø) of 18 µm. The intervals (pitch 1) between the plural convex portions 171b is 85 µm. Further, the thickness (H) of the insulation layer 172 made of $SiO_2$ in each second electrode 170 is 380 nm (=5Q). It should be noted that the metal reflecting layer 173 and the conductor portions 176 were formed by use of an IZO/silver alloy.

Next, as shown in FIG. 1, two types of semiconductor light-emitting elements 10 having these patterns were mounted on the submounts 15, and thereby two flip-chip type semiconductor light-emitting devices 1 were prepared. Subsequently, LED properties were measured for each of the two semiconductor light-emitting devices 1. The results are shown in Table 1. It should be noted that, in Table 1, Vf indicates a forward voltage (unit: V) and Po indicates light emission output (unit: mW).

TABLE 1

| | Thickness of transparent conductive layer (nm) | | Light emission output | | Forward voltage Vf | |
|---|---|---|---|---|---|---|
| | Thick portion (y) | Base portion (x) | Po (mW) | | (V) | |
| | | | Pattern 3 | Pattern 4 | Pattern 3 | Pattern 4 |
| | | | Po@ 20 mA | | | |
| Example 1A | 200 | 25 | 27.6 | 28.1 | 2.9 | 2.9 |
| Example 1B | | 50 | 26.8 | 27.0 | 2.9 | 3.0 |
| Comparative example 1A | 200 | | 25.7 | | 2.9 | |
| | | | Po@ 80 mA | | | |
| Example 1C | 200 | 25 | 84 | 86 | 3.2 | 3.25 |
| Example 1D | | 50 | 82 | 83 | 3.2 | 3.3 |
| Comparative example 1B | 200 | | 79 | | 3.2 | |

From the results shown in Table 1, it can be seen that, in the FC (flip-chip) type semiconductor light-emitting devices prepared in Example 1, the light emission output (Po: mW) is increased while suppressing the rise of the forward voltage (Vf: V) compared to the conventional semiconductor light-emitting element having the transparent conductive layer and the insulation layer but no plural thick portions.

Example 2

Based on the semiconductor light-emitting elements 10 prepared in Example 1, four flip-chip type semiconductor light-emitting devices 1 were prepared by using pattern 3 in FIG. 7C as the pattern of the thick portion of the transparent conductive layer 171 and changing the ratio (A/B) of an area (A) of the convex portions 171b to an area (B) of the base portion 171a, both constituting the transparent conductive layer 171. Subsequently, similar to Example 1, the LED properties were measured for each of these four semiconductor light-emitting devices 1. The results are shown in Table 2. It should be noted that, in Table 2, Po indicates the light emission output (unit: mW).

TABLE 2

| | Thickness of transparent conductive layer (nm) | | Light emission output Po (mW) | | | |
|---|---|---|---|---|---|---|
| | Thick portion (y) | Base portion (x) | (A/B) × 100 (%) | | | |
| | | | 6.7 | 10.8 | 19.1 | 32.5 |
| | | | Po@ 20 mA | | | |
| Example 2A | 200 | 25 | 26.2 | 27.6 | 28.1 | 27.0 |
| Example 2B | | 50 | 24.8 | 26.8 | 27.0 | 26.0 |
| Comparative example 2A | 200 | | 25.5 | | | |
| | | | Po@ 80 mA | | | |
| Example 2C | 200 | 25 | 80.1 | 84.4 | 86.4 | 81.6 |
| Example 2D | | 50 | 75.7 | 81.7 | 82.9 | 78.2 |
| Comparative example 2B | 200 | | 78.0 | | | |

Example 3

Based on the semiconductor light-emitting elements 10, three flip-chip type semiconductor light-emitting devices 1 were prepared by using IZODOT II-(1) in FIG. 9A, IZODOT II-(2) in FIG. 9B and IZODOT II-(3) in FIG. 9C as the pattern of the thick portion of the transparent conductive layer 171. Subsequently, the LED properties were measured for each of these three semiconductor light-emitting devices 1. The results are shown in Table 3. It should be noted that, in Table 3, Vf indicates the forward voltage (unit: V) and Po indicates the light emission output (unit: mW). Further, the thickness (5Q) of the insulation layer 172 is a value (380 nm) of fivefold $Q=(\lambda/4n)$ defined by use of the refractive index n of the insulation layer 172 and the light emission wavelength $\lambda$ (nm) of the light-emitting layer 150.

TABLE 3

| Pattern of thick portion IZODOT | Transparent conductive layer Thickness (nm) | | Thickness of insulation layer | Forward voltage Vf (V) | | | Light emission output Po (mA) | | |
|---|---|---|---|---|---|---|---|---|---|
| | Thick portion (y) | Base portion (x) | | Vf 20 mA | Vf 50 mA | Vf 80 mA | Po 20 mA | Po 50 mA | Po 80 mA |
| II-(1) | 200 | 25 | 5Q | 2.94 | 3.13 | 3.28 | 28.21 | 61.70 | 90.19 |
| II-(2) | 200 | 25 | 5Q | 2.94 | 3.13 | 3.27 | 27.98 | 60.50 | 87.92 |
| II-(3) | 200 | 25 | 5Q | 2.93 | 3.12 | 3.26 | 27.94 | 60.68 | 88.27 |
| — | 200 | | 5Q | 2.94 | 3.13 | 3.27 | 27.53 | 59.90 | 84.80 |

From the results shown in Table 3, it can be seen that, also in the case of using the semiconductor light-emitting elements in each of which the thick portion of the transparent conductive layer 171 has the pattern shown in FIG. 9A, 9B or 9C, the light emission output (Po: mW) is increased while suppressing the rise of the forward voltage (Vf: V) compared to the conventional semiconductor light-emitting element having the transparent conductive layer and the insulation layer but no plural thick portions.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light-emitting element comprising:
   a laminated semiconductor layer in which a first semiconductor layer having a first conduction type, a light-emitting layer and a second semiconductor layer having a second conduction type that is opposite to the first conduction type are laminated;
   a first electrode that is connected to the first semiconductor layer; and
   a second electrode that is provided on a surface of the second semiconductor layer,
   the second electrode including:
      a transparent conductive layer that includes a plurality of thick portions thicker than other portions and has transparency to light emitted from the light-emitting layer;
      an insulation layer that is laminated on the transparent conductive layer and has a refractive index lower than a refractive index of the transparent conductive layer;
      a metal reflecting layer that is laminated on the insulation layer and has conductivity; and
      a conductor portion that is provided through the insulation layer, one end of which is electrically connected to one of the thick portions of the transparent conductive layer and the other end of which is electrically connected to the metal reflecting layer.

2. The semiconductor light-emitting element according to claim 1, wherein the thick portions have convex portions on a side of the insulation layer.

3. The semiconductor light-emitting element according to claim 1, wherein the thick portions include any one of an isolation pattern and a lattice pattern in a planar view.

4. The semiconductor light-emitting element according to claim 1, wherein the insulation layer is composed of silicon dioxide.

5. The semiconductor light-emitting element according to claim 1, wherein the transparent conductive layer is composed of conductive oxide containing indium (In).

6. The semiconductor light-emitting element according to claim 1, wherein the laminated semiconductor layer is composed of a group III nitride semiconductor.

7. The semiconductor light-emitting element according to claim 1, wherein, in the laminated semiconductor layer, the first conduction type of the first semiconductor layer is an n-type in which a carrier is an electron and the second conduction type of the second semiconductor layer is a p-type in which a carrier is a hole.

8. The semiconductor light-emitting element according to claim 1, further comprising a first connector used for electrically connecting the first electrode to an outside and a second connector used for electrically connecting the second electrode to the outside.

\* \* \* \* \*